(12) United States Patent
Eva

(10) Patent No.: US 11,126,087 B2
(45) Date of Patent: Sep. 21, 2021

(54) COMPONENT FOR A MIRROR ARRAY FOR EUV LITHOGRAPHY

(71) Applicant: Carl Zeiss SMT GmbH, Oberkochen (DE)

(72) Inventor: Eric Eva, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/355,116

(22) Filed: Mar. 15, 2019

(65) Prior Publication Data

US 2019/0212654 A1     Jul. 11, 2019

Related U.S. Application Data

(63) Continuation of application No. PCT/EP2017/073376, filed on Sep. 17, 2017.

(30) Foreign Application Priority Data

Sep. 16, 2016   (DE) ..................... 10 2016 217 735.4

(51) Int. Cl.
*G03F 7/20* (2006.01)
*C22C 47/14* (2006.01)
(Continued)

(52) U.S. Cl.
CPC .......... *G03F 7/702* (2013.01); *C22C 32/0021* (2013.01); *C22C 47/04* (2013.01); *C22C 47/14* (2013.01); *C22C 49/02* (2013.01); *C22C 49/06* (2013.01); *G02B 1/10* (2013.01); *G03F 7/7015* (2013.01); *G03F 7/70033* (2013.01);
(Continued)

(58) Field of Classification Search
CPC . G03F 7/7095; G03F 7/70958; G03F 7/70316
See application file for complete search history.

(56) References Cited

U.S. PATENT DOCUMENTS 4,083,719 A * 4/1978 Arakawa ................. C22C 49/14
                                                              252/503
5,589,652 A * 12/1996 Arato ....................... B22F 1/0007
                                                              419/12
(Continued)

FOREIGN PATENT DOCUMENTS

JP         2004076043 A  *  3/2004   ............... C22C 1/10
KR         101686973 B1  * 12/2016   ............... B22F 1/00

OTHER PUBLICATIONS

PCT International Preliminary Report on Patentability and Written Opinion, PCT/EP2017/073376, dated Mar. 19, 2019, 6 pages.

*Primary Examiner* — Brooke Purinton
(74) *Attorney, Agent, or Firm* — Edell, Shapiro & Finnan, LLC

(57) ABSTRACT

A component for a mirror array for EUV lithography, particularly for use in faceted mirrors in illumination systems of EUV lithography devices. A component (500) for a mirror array for EUV lithography is proposed which is at least partially made from a composite material including matrix material (502) that contains copper and/or aluminium, and reinforcing material in the form of fibers (504). The composite material also includes particles (508) that consist of one or more of the materials from the group: graphite, adamantine carbon, and ceramic.

19 Claims, 5 Drawing Sheets

(51) Int. Cl.
*C22C 47/04* (2006.01)
*C22C 49/02* (2006.01)
*C22C 49/06* (2006.01)
*C22C 32/00* (2006.01)
*G02B 1/10* (2015.01)

(52) U.S. Cl.
CPC ........ *G03F 7/70075* (2013.01); *G03F 7/7095* (2013.01); *G03F 7/70116* (2013.01); *B22F 2998/10* (2013.01); *B22F 2999/00* (2013.01)

(56) References Cited

U.S. PATENT DOCUMENTS

| | | | | |
|---|---|---|---|---|
| 7,843,632 | B2* | 11/2010 | Bowering | G02B 5/0891 250/504 R |
| 2009/0035554 | A1* | 2/2009 | Fujita | C04B 35/803 428/325 |
| 2009/0197082 | A1* | 8/2009 | Jiang | H01B 1/04 428/367 |
| 2009/0237886 | A1* | 9/2009 | Iwai | H01L 23/373 361/708 |
| 2011/0181852 | A1* | 7/2011 | Bleidistel | G03F 7/70291 355/30 |
| 2012/0132864 | A1* | 5/2012 | Kar | C08K 7/06 252/511 |
| 2013/0015122 | A1* | 1/2013 | Awadh | B82Y 30/00 210/500.21 |
| 2013/0071594 | A1* | 3/2013 | Bikson | F28D 21/0015 428/36.9 |
| 2013/0344325 | A1* | 12/2013 | Nguyen | B32B 7/00 428/343 |
| 2014/0199524 | A1* | 7/2014 | Rukavina | C08G 64/42 428/174 |
| 2015/0184055 | A1* | 7/2015 | Raman | B29C 48/03 252/75 |
| 2015/0375490 | A1* | 12/2015 | Balachandra | B29C 65/00 156/313 |
| 2016/0107739 | A1* | 4/2016 | Restuccia | B29B 9/14 428/114 |
| 2016/0136923 | A1* | 5/2016 | Zhao | B32B 5/16 428/213 |
| 2016/0284449 | A1* | 9/2016 | Haq | B29C 65/1425 |
| 2016/0342095 | A1* | 11/2016 | Bieling | G03F 7/70291 |
| 2016/0375618 | A1* | 12/2016 | Maslakow | B32B 3/266 428/131 |
| 2017/0120566 | A1* | 5/2017 | Aldousari | B32B 5/16 |
| 2017/0233538 | A1* | 8/2017 | Drozdzak Matusiak | C08K 5/14 523/209 |

* cited by examiner

COMPONENT FOR A MIRROR ARRAY FOR EUV LITHOGRAPHY

CROSS REFERENCE TO RELATED APPLICATIONS

This is a Continuation of International Application PCT/EP2017/073376, which has an international filing date of Sep. 17, 2017, and which claims priority to German Patent Application 10 2016 217 735.4 filed Sep. 16, 2016. The disclosures of both applications are incorporated in their respective entireties into the present Continuation by reference.

FIELD OF INVENTION

In order to be able to produce ever finer structures during the production of, for example, semiconductor components using lithographic methods, light of ever shorter wavelengths is employed. If the operating wavelength range employed is in the extreme ultraviolet (EUV), for instance at wavelengths of between approximately 5 nm and 20 nm, it is no longer possible to employ elements like lens elements in transmission, rather illumination and projection lenses are constructed from mirror elements having highly reflective coatings adapted to the respective operating wavelength.

BACKGROUND

The illumination systems of EUV lithography apparatuses usually contain two facet mirrors, each comprising a multiplicity of mirror facets arranged closely alongside one another. In order to be able to set the directions from which a mask having structures that are intended to be imaged onto a wafer is illuminated with radiation of the operating wavelength, the mirror facets are individually adjustable with the aid of actuators. In this case, the mirror facets are arranged very densely on a carrying structure, such that the space available for actuators and joints is limited. Since EUV lithography apparatuses have to be operated in a vacuum, heat that arises in the mirror facets as a result of absorption of the incident radiation cannot be dissipated by way of a gas flow. The cooling therefore has to be carried out predominantly by way of heat conduction, which makes the articulated linking of the mirror facets to the carrying structure more difficult.

Generic components for a mirror array for the EUV lithography apparatus are known for example from DE 10 2013 215 169 A1. In accordance with said document, the conditions are particularly problematic in the case of the field facet mirror, the mirror facets of which are imaged by mirror facets of the pupil facet mirror onto the mask in such a way that the images of the field mirror facets are superimposed on the mask and thus illuminate the latter uniformly. In order to avoid light losses, the gaps between adjacent field mirror facets have to be as narrow as possible, which leads to particularly confined space conditions. The space conditions are critical because the actuators and joints of the field mirror facets are implemented with greater complexity than in the case of the pupil mirror facets, since the field mirror facets are not permitted to move laterally in the case of tilting. Moreover, the problem of heat dissipation is more serious in the case of the field facet mirror since the latter is situated in the beam path upstream of the pupil facet mirror.

In order to satisfy the stringent requirements in respect of thermal conductivity, stresses allowed in the material, stiffness and strength in the case of components for mirror arrays, particularly in the case of facet mirrors in illumination systems of EUV lithography apparatuses, hitherto they have been produced, inter alia, from dispersion-hardened metals or precipitation-hardened alloys, preferably copper or copper alloys, aluminum or aluminum alloys or copper-aluminum alloys. Naturally hard alloys are also suitable.

It has been found, however, that owing to lack of space the dimensioning of the components may in part be so thin that the cross section of said components is of the order of magnitude of the grain sizes of precipitation-hardened alloys, such that locally it can happen that a component cross section is formed by merely one to two grains, which jeopardizes the long-term stability of the component and cannot be detected during production. Owing to the generally smaller grain size in the case of dispersion-hardened metal, e.g. copper, this risk is lower. However, they exhibit a poorer creepage behavior. In addition, there is a greater probability that, during soldering processes, solder will be alloyed in or, during in-situ cleaning of mirror arrays using hydrogen, in particular atomic hydrogen, the latter will penetrate into the component and result in damage there.

SUMMARY

It is an object of the present invention to improve the known components for mirror arrays for EUV lithography.

This object is achieved with a component for a mirror array for EUV lithography, which component it is produced at least partly from a composite material comprising a copper- and/or aluminum-containing matrix material and comprising a reinforcing material in the form of fibers, the composite material additionally comprises particles composed of one or more of the materials from the group graphite, diamond-like carbon and ceramic.

The matrix material can be copper alloys or aluminum alloys, in particular naturally hard or precipitation-hardened alloys. It is preferably aluminum, particularly preferably copper.

It has been found that these fiber-reinforced composite materials allow the provision even of components having narrow dimensioning for mirror arrays for EUV lithography, which components have both a sufficient thermal conductivity and a sufficient strength. In particular, in conjunction with sufficient thermal conductivity, it is possible to design components with a sufficient safety factor between stresses occurring in the component and the yield point of the material. One particular advantage, moreover, is that particularly in the case of very thin components or components having very thin locations near or in the region of the grain sizes of the matrix material, the risk of breaking under continuous loading is reduced.

It has been found, moreover, that if the composite material additionally comprises particles composed of one or more of the materials from the group graphite, diamond-like carbon and ceramic, the material properties can additionally be improved in a desired direction. In this regard, inter alia, the strength, the thermal conductivity and the creepage properties can be improved.

Both as reinforcing material and as additional particles, the carbon-based materials, in particular, have the advantage that substantially the thermal conductivity of copper can be maintained in conjunction with higher mechanical strength and better creepage behavior.

In preferred embodiments, the composite material comprises as reinforcing material one or more from the group carbon nanotubes, carbon fibers, mineral fibers, glass fibers and ceramic fibers. In the case of the mineral fibers, asbestos or wollastonite fibers are particularly preferred with regard to good thermal conductivity and high strength of the component; in the case of the ceramic fibers, particular preference is given to silicon carbide fibers, fibers composed of mixtures of aluminum oxide and silicon oxide such as, for example, mullite, or fibers composed of boron oxide or zirconium oxide or composed of carbosilanes. In the case of glass fibers, in particular fibers composed of quartz glass or composed of doped quartz glass are preferred.

The components can be any structural parts of a mirror array which serve in the broadest sense for mounting the mirror elements. The mounting can also be configured to be movable, as may be the case in facet mirrors, in particular, in order to be able to adjust the orientation of individual mirror facets or mirror facet groups. Preferably, the component is configured as a structural part of a mirror joint, which can have a longer lifetime as a result since the risk of creepage or breaking is lower, which can also increase the positioning accuracy.

In particular, it is advantageous if the matrix material, in particular a copper or aluminum matrix, is dispersion-hardened and has further increased strength as a result by comparison with a pure matrix material, for instance.

In preferred embodiments, the fibers composed of reinforcing material and/or the particles are coated. This makes it possible to reduce the risk that hydrogen or other reactive gases that might penetrate into the component during operation or cleaning through the matrix material, in particular the copper matrix material, will react with the reinforcing material or the particle material and contribute to corrosion of the component. The coating can also serve as an adhesion promoter to the copper matrix or some other matrix material. Advantageously, the particles and/or fibers are coated with one or more materials from the group noble metal, metal oxide, molybdenum and silicon. Molybdenum/silicon multilayer coatings, inter alia, have proved to be suitable as a diffusion barrier against hydrogen.

In preferred embodiments, the component comprises reinforcing fibers whose arrangement in the matrix material substantially corresponds to the geometry of the component. The component can thereby be reinforced in particular in the direction of the forces acting in the component during operation.

With regard to protection against hydrogen embrittlement or the negative influence of other reactive gases to which the component might be exposed during operation or cleaning of the EUV lithography apparatus, the component is preferably at least partly coated. Particularly preferably, it is coated on all sides. In the case of relatively solid components, it is possible to provide ventilation holes allowing hydrogen that may have penetrated through cracks or defects to emerge from the components. The ventilation holes can be laser-drilled, for example.

Advantageously, the component is coated with one or more materials from the group noble metal, metal oxide, molybdenum and silicon, particularly in the case of reinforcing material or additional particles on the basis of carbon such as graphite, diamond-like carbon or carbon nanotubes, which can be attacked particularly severely by hydrogen. Molybdenum/silicon multilayer coatings, inter alia, have proved to be suitable as a diffusion barrier against hydrogen.

Preferably, the component has a yield point Rp0.2 of greater than 200 N/mm$^2$ at 20° C., preferably of greater than 400 N/mm$^2$ at 20° C., in particular for copper-containing components. The yield point Rp0.2 is also called proof stress or elastic limit. It corresponds to the mechanical stress for which the remaining extension relative to the initial length of a sample after load relief is 0.2%.

Advantageously, the component has a thermal conductivity of greater than 320 W/mk, preferably of greater than 370 W/mk, particularly in the case of a component comprising copper as matrix material which comprises reinforcing fibers and/or particles composed of silicon carbide, graphite or diamond. As a result of the high thermal conductivity, such a component is particularly well suited to use in the vacuum of an EUV lithography apparatus.

In a further aspect, the object is achieved by a method for producing a component as described, comprising the following steps:
introducing reinforcing material into the matrix material;
shaping the component from the matrix material with reinforcing material;
sintering and/or compacting the shape of the component and/or finishing the latter, wherein the matrix material is introduced in the form of freshly reduced metal powder or the shaping and/or the sintering and/or the compacting are/is carried out in a reducing atmosphere.

By processing freshly reduced powder, in particular aluminum or copper powder, or carrying out one or more production steps in a reducing atmosphere, it is possible to ensure that the material of the component is as free from oxygen as possible and is resistant to hydrogen embrittlement.

It is possible for example to work on the basis of powder metallurgy or to introduce the reinforcing fibers into molten matrix material.

Optionally, particles composed of, for example, graphite, diamond-like carbon and/or ceramic such as silicon carbide, for instance, can be added in addition to the reinforcing fibers. Moreover, dispersion hardening can be performed by adding ultrafinely divided aluminum oxide, for example. Furthermore, the fibers composed of reinforcing material or the additional particles, before being introduced into the matrix material particularly if they are carbon-based, for protection against hydrogen, can be coated with noble metal, metal oxide or else Mo/Si multilayers for example by electroplating or chemical or physical vapor deposition such as, for instance, vapor deposition or sputtering.

Preferably, a fibrous precursor material of the reinforcing material and/or in addition precursor material for additional particles are/is introduced into the matrix material and, during the shaping and/or the sintering and/or the compacting, the precursor material reacts to form reinforcing material and/or to form particle material. In this regard, for particle formation, for example, it is possible to introduce carbon compounds which carbonize only during compacting to form carbon in the form of graphite or diamond-like carbon in particular in a reducing atmosphere. Alternatively, it is possible to introduce nanodisperse boron, for example, which reacts with oxygen present in the matrix material to form boron oxide particles and thus binds the oxygen. It is likewise possible to introduce boron threads that react to form boron oxide fibers.

Depending on the choice of the reinforcing material and, if appropriate, the material of the additional particles and depending on the geometry of the component to be produced, the shaping and/or sintering and/or compacting can be carried out through extrusion, laser sintering, plasma sintering, hot pressing and/or hot isostatic pressing.

Depending on the geometry and planned location of use in the mirror array, the finishing of the component can be carried out through erosion, milling, grinding, polishing and/or coating. The coating can take place, inter alia, using electroplating or chemical or physical deposition from the gas phase.

BRIEF DESCRIPTION OF THE DRAWINGS

The present invention will be explained in greater detail with reference to one preferred exemplary embodiment. In this respect, schematically.

DETAILED DESCRIPTION

Figure 1:
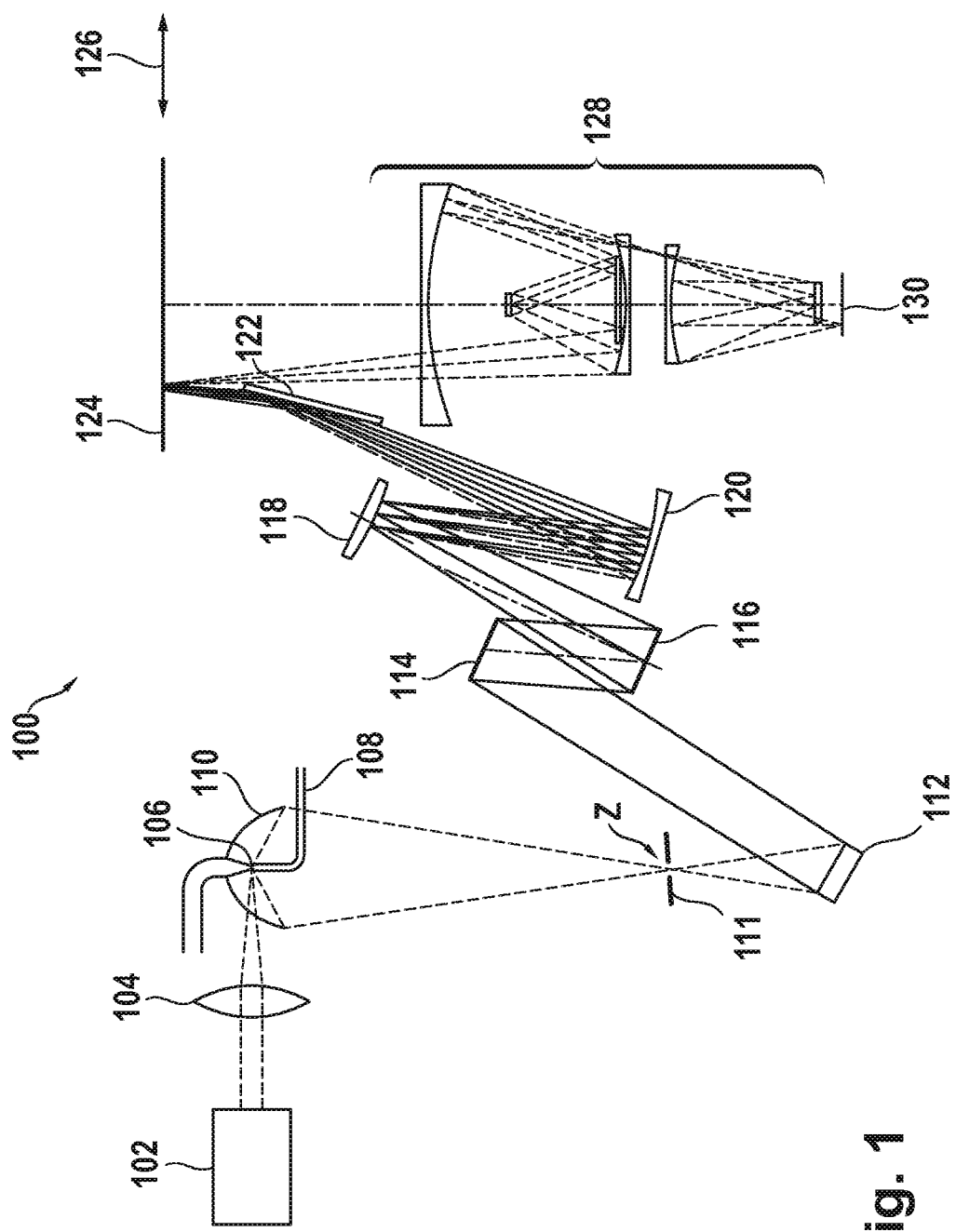
FIG. 1 shows an EUV lithography apparatus.

FIG. 1 shows, in a basic view, an EUV lithography apparatus 100 for producing microelectronic components, for example, which is operated with an operating wavelength in the EUV range in a scan mode along a scan direction 126 and which can comprise one or more mirror arrays having components composed of fiber-reinforced copper. The EUV lithography apparatus 100 shown in FIG. 1 comprises a point-type plasma radiation source. The radiation from the laser source 102 is directed, via a condenser lens 104, onto suitable material, which is introduced via the feed 108 and excited to a plasma 106. The radiation emitted by the plasma 106 is imaged by the collector mirror 110 onto the intermediate focus Z. Appropriate stops 111 at the intermediate focus Z ensure that no undesired stray radiation is incident on the subsequent mirrors 112, 114, 116, 118, 120 of the illumination system of the projection exposure apparatus 100. The plane mirror 122 serves for folding the system, so as to offer installation space for mechanical and electronic components in the object plane in which the mount for the reticle 124 is arranged. The mirror 112 in the present example is followed in the illumination system by a field facet mirror 114 and a pupil facet mirror 116. The field facet mirror 114 serves to project a multiplicity of images of the radiation source of the EUV lithography apparatus into a pupil plane, in which a second facet mirror is arranged, which serves as pupil facet mirror 116 and superimposes the images of the facets of the field facet mirror 114 in the object plane so as to make possible the most homogeneous illumination possible. The mirrors 118 and 120, which are arranged downstream of the facet mirrors 114, 116, substantially serve to shape the field in the object plane. Arranged in the object plane is a structured reticle 124, the structure of which is imaged onto the object 130 to be exposed, for example a wafer, using a projection lens 128, which has six mirrors in the present example. The reticle 124 in the EUV lithography apparatus 100, which is designed here as a scanning system, is displaceable in the marked direction 126 and is progressively illuminated in sections in order to correspondingly project the respective structures of the reticle 124 onto, for example, a wafer 130 using the projection lens.

Figure 2:
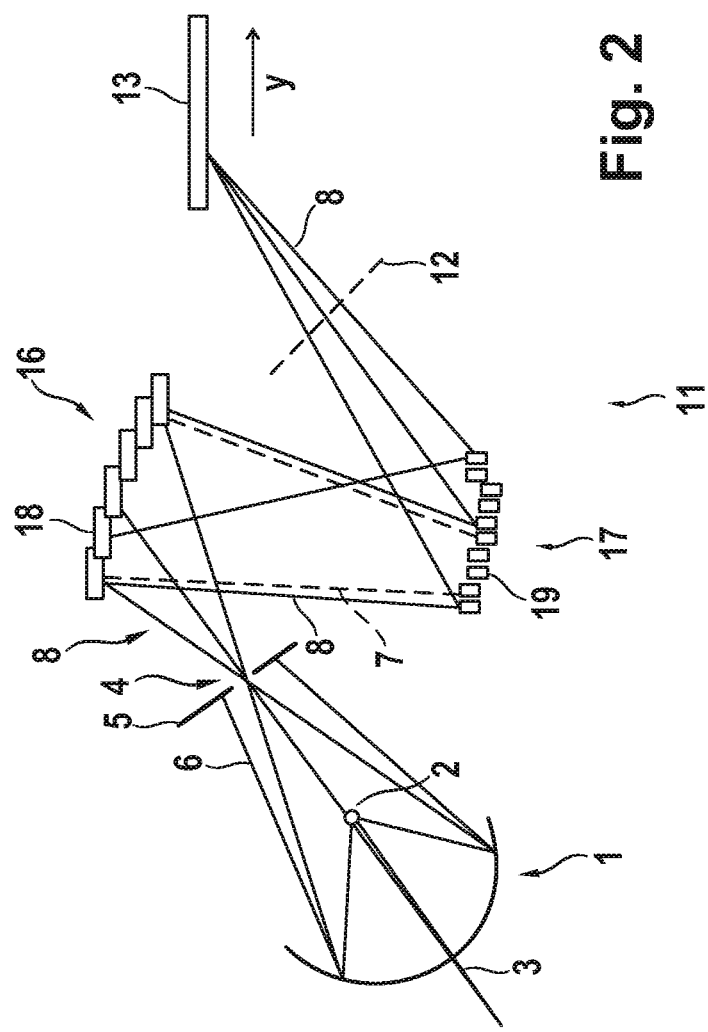
FIG. 2 shows an illumination system of an EUV lithography apparatus.

FIG. 2 illustrates a radiation source in connection with an illumination system 11, which is part of an EUV lithography apparatus. A collector 1 is arranged around a light source that is formed by a plasma droplet 2, which is excited by an infrared laser 3. In order to obtain wavelengths in the region around, for example, 13.5 nm in the EUV wavelength range, e.g. tin can be excited to a plasma using a carbon dioxide laser operating at a wavelength of 10.6 µm. Instead of a carbon dioxide laser, it is also possible to use solid-state lasers, for example. The collector 1 is followed, downstream of the stop 5, which removes a part 6 of the emitted radiation from the beam path, at the intermediate focus 4, by a field facet mirror array 16 having individual mirror facets 18 and a pupil facet mirror array 17 having individual mirror facets 19, wherein the mirror arrays 16, 17 comprise components composed of fiber-reinforced copper. Radiation 7, 8 is reflected from each field mirror facet 18 onto each pupil mirror facet 19. Before the rays are incident on the reticle 13, which has the structure that is to be projected onto a wafer and which is to be scanned in the y-direction, they are also deflected by a folding mirror 12. The folding mirror 12 has less of an optical function and rather serves to optimize the space requirement of the illumination system 11.

It should be pointed out that a wide variety of radiation sources can be used in EUV lithography, inter alia plasma sources which may be based on laser excitation (LPP sources) or gas discharge (DPP sources), for instance, synchrotron radiation sources or free electron lasers (FEL). Furthermore, the collectors can have any desired design, including as a Wolter collector or as an ellipsoidal collector, preferably adapted to the radiation source that is used in each case. Moreover, the illumination system of an EUV lithography apparatus can also have any desired design and comprise inter alia, instead of or else in addition to the facet mirrors, fly's eye condensers, specular reflectors, movable optical components or the like.

All these mirror arrays can comprise components in the form of holding, carrying or joint elements for which the requirements in respect of strength and thermal conductivity are stringent and which can be produced from components for a mirror array for EUV lithography which consist at least partly of a composite material comprising copper- or aluminum-containing matrix material and comprising reinforcing material in the form of fibers. Without restricting the generality, the component proposed here is explained below on the basis of the example of a flexure 396 of a field mirror facet 373, as illustrated in FIG. 3.

Figure 3:
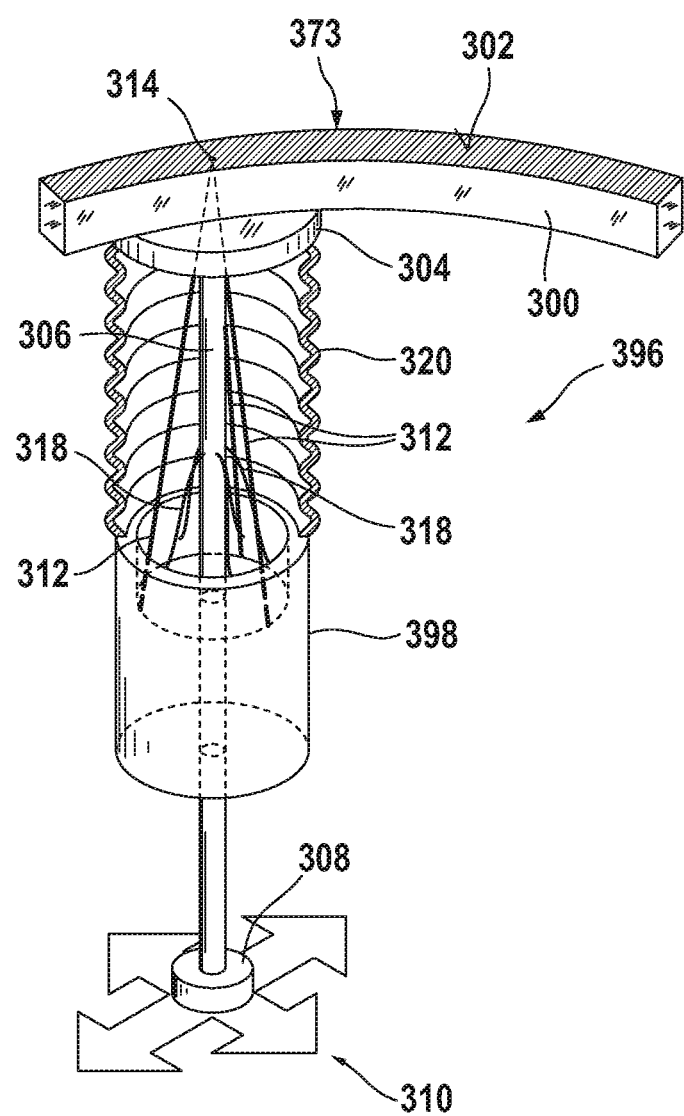
FIG. 3 shows a detail view of a mirror array.

FIG. 3 shows, in a perspective illustration, how a field mirror facet 373 is connected to a securing sleeve 398 via a flexure 396, said securing sleeve having a ring-shaped cross section and being rigidly secured to a carrier plate (not illustrated here). The securing sleeves 398 together with the carrier plate form a carrying structure for the field mirror facets 373, relative to which the field mirror facets 373 are tiltable.

The field mirror facet 373 has a substrate 300 bearing a reflective coating 302. The reflective coating is designed to reflect the illumination radiation such that at least 60% and preferably at least 70% of the incident radiation is reflected. For this purpose, in the exemplary embodiment illustrated, the reflective coating 302 comprises an alternating sequence of thin layers of molybdenum and silicon, which has its maximum reflectivity upon quasi-normal incidence at a wavelength of approximately 13.5 nm.

In the exemplary embodiment illustrated, the field mirror facet 373 is carried eccentrically by a carrying element 304 having the shape of a circular disk. An actuating rod 306 extending through the securing sleeve 398 is integrally formed centrally on the underside of the carrying element 304. An end piece 308 is integrally formed on the actuating rod 306 at its opposite end, on which end piece an actuator (not illustrated) can act for the purpose of tilting the field mirror facet 373. This is indicated by a crossed double-headed arrow 310 in FIG. 3.

The flexure 396 connects the actuating rod 306 to the securing sleeve 398. For this purpose, the flexure 396 comprises three joint legs 312 arranged around the actuating rod 306 and secured to the inner surface of the securing sleeve 398 at one end and to the carrying element 304 at the other end. The angle between adjacent joint legs 312 here is 120° in each case. If the joint legs 312 were lengthened virtually beyond the carrying element 304, as is indicated by dashed lines in FIG. 3, then the joint legs 312 would meet at a tilt point 314 lying at least approximately on the reflective coating 302 of the field mirror facet 373.

If the actuating rod 306 is deflected with the aid of an actuator, then the field mirror facet 373 is pivoted around the tilt point 314, with the joint legs 312 bending. The bending stiffness of the joint legs 312 thus defines the bending resistance that has to be overcome by the actuator in order to tilt the field mirror facet 373. Owing to the uniform distribution of the joint legs 312 around the actuating rod 306, the bending resistance of the flexure 396 is approximately isotropic, such that the flexure 396 presents approximately the same bending resistance in opposition to tilting of the field mirror facet 373 about each of the two orthogonal tilt axes.

In addition to the joint legs 312, a plurality of thermally conductive fibers 318 extend between the securing sleeve 398 and the actuating rod 306. The thermally conductive fibers 318 have a particularly high thermal conductivity. Moreover, they have a considerably smaller cross section and thus also a smaller bending stiffness than the joint legs 312, such that they present only a small bending resistance in opposition to a deflection of the field mirror facet 373. Heat that arises as a result of the partial absorption of the illumination radiation in the field mirror facet 373 can thus be dissipated to the carrier plate not only via the joint legs 312 but also in part via the thermally conductive fibers 318. If as many components as possible, such as carrying element 304, actuating rod 306, end piece 308, joint leg 312 and securing sleeve 398, as proposed, are produced at least partly from fiber-reinforced copper- or aluminum-containing matrix material, preferably fiber-reinforced aluminum, particularly preferably fiber-reinforced copper, thermally conductive fibers 318 can also be dispensed with.

Furthermore, a bellows 320 extends between the carrying element 304 and the securing sleeve 398, said bellows closing off the interspace between the field mirror facet 373 and the securing sleeve 398 with respect to an exterior space. The bellows 320 firstly prevents small particles that detach from parts of the flexure 396 or of the thermally conductive fibers 318 owing to mechanical or thermal loading from passing into the exterior space and adversely affecting the function of the illumination system by settling e.g. on mirror surfaces. The bellows 320 additionally ensures that the field mirror facet 373 does not rotate about the longitudinal axis of the bellows 320.

Figure 4:
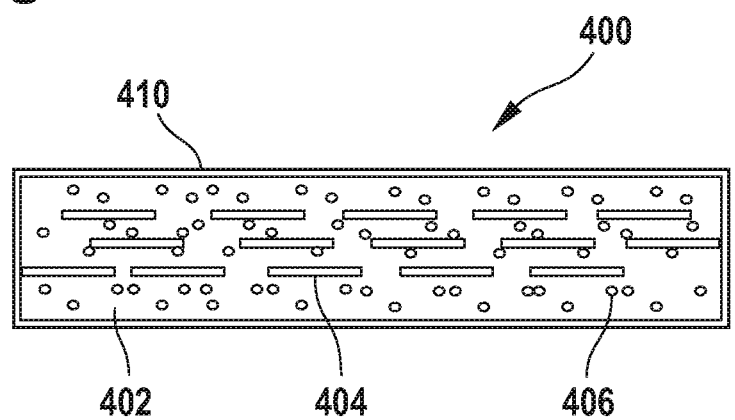
FIG. 4 shows a first embodiment of a component.

FIG. 4 schematically illustrates a component for a mirror array for EUV lithography, which in the example present here is produced at least partly from a composite material comprising copper as matrix material and comprising reinforcing material in the form of fibers, which component is configured as a structural part 400 of a mirror joint in the present example. It could be configured for instance as a joint leg 312 as illustrated in FIG. 3.

In the example illustrated in FIG. 4, the structural part 400 comprises reinforcing fibers 404 in the matrix material 402 composed of copper. The reinforcing fibers can be composed of one or more materials from the group carbon nanotubes, carbon fibers, mineral fibers, glass fibers and ceramic fibers. In the case of the mineral fibers, asbestos or wollastonite fibers are particularly preferred; in the case of the ceramic fibers, particular preference is given to silicon carbide fibers, fibers composed of mixtures of aluminum oxide and silicon oxide such as, for example, mullite, or fibers composed of boron oxide or zirconium oxide or composed of carbosilanes. In the case of glass fibers, in particular fibers composed of quartz glass or composed of doped quartz glass are preferred. The materials mentioned are in part more likely obtainable as short fibers such as the carbon nanotubes or the naturally occurring mineral fibers. The synthetically produced fibers composed of, in particular, glass, carbon or silicon carbide are obtainable in virtually any desired length. It is possible to achieve a modulus of elasticity in the range of approximately 170 GPa to 220 GPa in the case of fiber-reinforced aluminum, and even in the range of approximately 230 GPa to 280 GPa in the case of fiber-reinforced copper.

Before being introduced into the matrix material 402, the reinforcing fibers 404 can be coated in advance, for example with one or more materials from the group noble metal, metal oxide, molybdenum and silicon. Preferably, they are coated with gold, platinum, palladium, titanium, a metal oxide or a multilayer coating composed of alternating molybdenum and silicon layers. Particularly in the case of carbon-based fibers, this is good protection against hydrogen that might penetrate into the matrix copper and lead to embrittlement of the structural part. In the case of ceramic fibers or glass fibers, in particular, the coating can perform the function of an adhesion promoter between fiber and matrix and thus contribute to a better transfer of the forces acting on the structural part to the reinforcing fibers, which can lead to increased strength. The coating can be carried out using customary methods, e.g., chemical or physical vapor deposition or else electrolytically.

In the example illustrated in FIG. 4, the matrix material 402 composed of copper is additionally hardened with dispersoids 406 composed of aluminum oxide, for example. In variants, dispersion-hardened aluminum can also be used as matrix material. However, naturally hard or precipitation-hardened aluminum or copper alloys can also be used. With regard to copper alloys, by way of example, CuMg0.1, CuMg0.3, CuMg0.4, CuMg0.5, CuMg2.5, CuFe2P, CuCr, CuZr, CuCr1Zr, CuCrAgFeTiSi, CuBe2 are suitable.

As additional protection against reactive gases such as hydrogen, for instance, which is used during mirror cleaning, the structural part 400 is coated, specifically here with a coating 410 on all sides which is composed, for example, of one or more materials from the group noble metal, metal oxide, molybdenum and silicon. Preferably, they are coated with gold, platinum, palladium, titanium, a metal oxide or a multilayer coating composed of alternating molybdenum and silicon layers. This coating, too, can be carried out through customary methods, e.g., chemical or physical vapor deposition, in particular for molybdenum/silicon multilayer coatings. Otherwise, an electrolytic coating is preferred. Depending on how the structural part is installed in the mirror joint or the mirror array, it may also be sufficient to coat only parts of its surface.

In the example illustrated in FIG. 4, the arrangement of the reinforcing fibers 404 in the matrix material 402 substantially corresponds to the geometry of the structural part 400. The fibers 404 are aligned in the longitudinal direction of the structural part 400.

Figure 5:
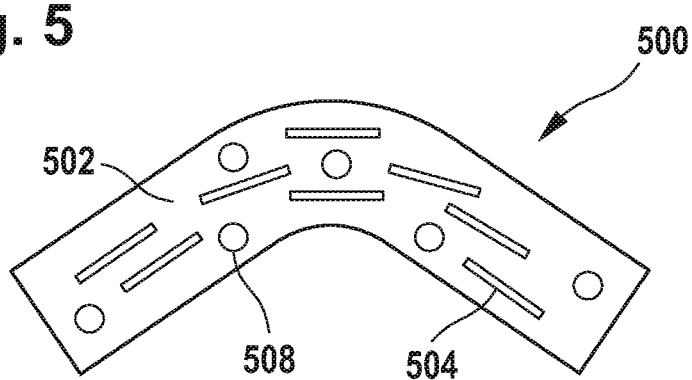
FIG. 5 shows a second embodiment of a component.

In the example illustrated in FIG. 5, too, the arrangement of the reinforcing fibers 504 in the matrix material 502 substantially corresponds to the geometry of the structural part 500. The structural part 500 is bent and the alignment of the fibers 504 also substantially follows this bend. The longer the fibers 504, the easier it is also to arrange them in a manner corresponding to more complex geometries having a plurality of bends, for example. The explanation given concerning the reinforcing fibers in connection with the example shown in FIG. 4 is likewise applicable to the reinforcing fibers 504. Optionally, the matrix material can comprise aluminum or copper, and in particular can be composed of copper or aluminum. The matrix material can moreover be dispersion-hardened.

In the example illustrated in FIG. 5, the structural part 500 additionally comprises particles 508, for example composed of one or more of the materials from the group graphite, diamond-like carbon and ceramic. As a result, the strength and the creepage properties and, in particular with particles composed of graphite or preferably diamond-like carbon, the thermal conductivity as well can be increased.

In this regard, as already explained for the reinforcing fibers in association with FIG. 4, the particles 508 can also be coated in order to protect them against reactive gases or to improve the adhesion to the copper of the matrix material 502. They can likewise be coated for example with one or more materials from the group noble metal, metal oxide, molybdenum and silicon. Preferably, they are coated with gold, platinum, palladium, titanium, a metal oxide or a multilayer coating composed of alternating molybdenum and silicon layers. The coating can be carried out using customary methods, e.g., through chemical or physical vapor deposition or else electrolytically.

The structural parts 400, 500 on the basis of a fiber-reinforced copper matrix as illustrated here by way of example have a yield point Rp0.2 of greater than 400 N/mm² at 20° C., such that even stresses that occur for example in holding, carrying or joint elements of mirror arrays for EUV lithography do not lead to plastic deformations.

The structural parts 400, 500 illustrated here additionally have a thermal conductivity of greater than 320 W/mK. Here the coefficient of thermal expansion is lower than in the case of copper, which contributes to the precision of the mirror arrays for EUV lithography in which such structural parts are used. Using carbon nanotubes, carbon fibers or else additional particles composed of graphite or diamond-like carbon, it is possible even to achieve thermal conductivities of 370 W/mK or significantly higher. Through the structural parts presented here, even in the vacuum prevailing in EUV lithography, to a significant extent heat can be dissipated from the mirrors to more remote heatsinks.

Figure 6:
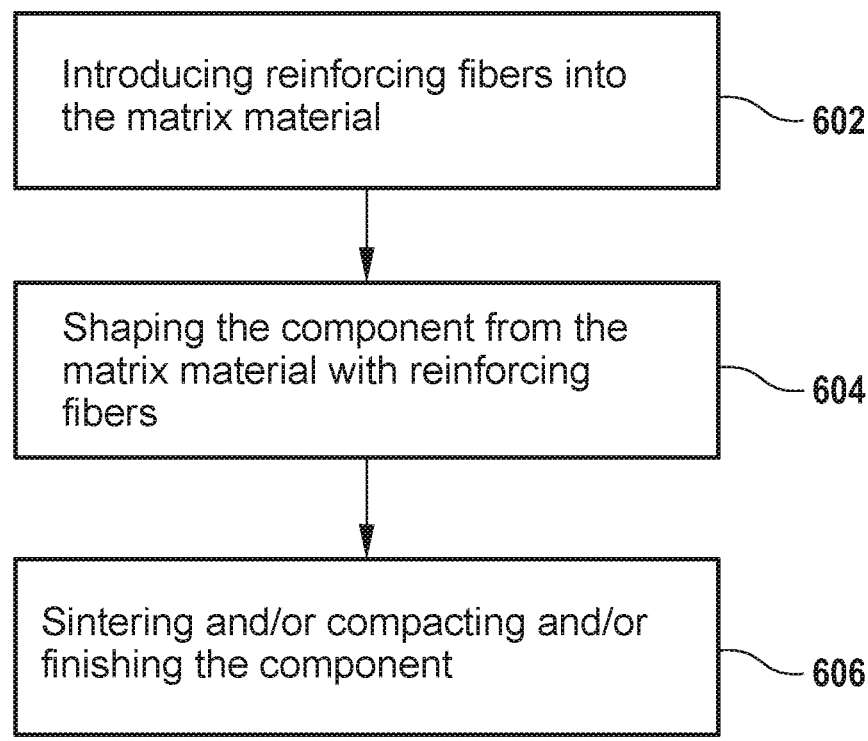
FIG. 6 shows a method for producing a component.

A method for producing a component described above is illustrated schematically in FIG. 6. It includes the following steps:

introducing reinforcing material into the matrix material (step 602);

shaping the component from the matrix material with reinforcing material (step 604);

sintering and/or compacting the shape of the component and/or finishing the latter (step 606).

With regard to resistance to hydrogen embrittlement, which is important for use in EUV lithography, it is of importance that the matrix material is introduced in the form of freshly reduced powder or the shaping and/or the sintering and/or the compacting are/is carried out in a reducing atmosphere. A material that is as free from oxygen as possible can also be obtained in this way. It is also possible to combine both measures. The powder is copper alloys or aluminum alloys in powder form. It is preferably aluminum powder, particularly preferably copper powder.

It is possible for example to work on the basis of powder metallurgy or to introduce the reinforcing fibers into molten matrix material.

In variants, a fibrous precursor material of the reinforcing material and/or in addition precursor material for additional particles are/is introduced into the matrix material and, during the shaping and/or the sintering and/or the compacting, the precursor material reacts to form reinforcing material and/or to form particle material. In this regard, for particle formation, for example, it is possible to introduce carbon compounds which carbonize only during compacting to form carbon in the form of graphite or diamond-like carbon in particular in a reducing atmosphere. Alternatively, it is possible to introduce nanodisperse boron, for example, which reacts with oxygen present in the matrix material to form boron oxide particles and thus binds the oxygen. It is likewise possible to introduce boron threads that react to form boron oxide fibers.

Depending on the choice of the reinforcing material and, if appropriate, the material of the additional particles and depending on the geometry of the component to be produced, the shaping and/or sintering and/or compacting can be carried out using extrusion, laser sintering, plasma sintering, hot pressing and/or hot isostatic pressing. In this regard, it is possible to extrude in particular rather rod-shaped components. This has the effect even in the case, in particular, of relatively short reinforcing fibers that the extrusion process can lead to a coarse alignment of the fibers in the extrusion direction. Components having rather complex and finely divided geometries can also be processed with the aid of laser sintering or spark plasma sintering. Compacting by hot pressing has proved worthwhile for more planar geometries.

Hot isostatic pressing is advantageous for compacting generally or subsequent compacting of extrudates, for example. It allows the production of a great variety of components with near net shape geometries or even net shapes, such that the outlay for finishing using eroding, milling, grinding and/or polishing, for example, can be minimized. The mixture of reinforcing fibers and, if appropriate, particles or precursor material with matrix material can be introduced inter alia as powder into an encapsulated mold, which is subsequently exposed to an isostatic pressure of approximately 1 bar and at the same time a temperature of approximately 1000° C. to 1100° C. Using quartz glass or doped quartz glass, composite materials comprising glass fiber reinforcement in the matrix can also be processed using hot isostatic pressing.

With regard to use in an EUV lithography apparatus, advantageously a last production step can involve carrying out a coating of the component as far as possible on all sides as protection against reactive gases such as hydrogen, for instance, with noble metal, such as gold, platinum, titanium or palladium, for instance, one or more metal oxides and/or an Mo/Si multilayer coating using customary methods of chemical or physical vapor deposition or preferably electrolytically.

Optionally, particles composed of, for example, graphite, diamond-like carbon and/or ceramic such as silicon carbide, for instance, can be added in addition to the reinforcing fibers. Moreover, dispersion hardening can be performed by adding ultrafinely divided aluminum oxide, for example. Furthermore, the fibers composed of reinforcing material or the additional particles, before being introduced into the matrix material particularly if they are carbon-based, for protection against hydrogen, can be coated with noble metal, metal oxide or else an Mo/Si multilayer coating for example by electroplating or chemical or physical vapor deposition such as, for instance, vapor deposition or sputtering.

REFERENCE SIGNS

1 Collector
2 Plasma droplet
3 Infrared laser
4 Intermediate focus
5 Stop
6 Radiation
7 Radiation
8 Radiation
11 Illumination system
12 Folding mirror
13 Reticle
16 Field facet mirror array
17 Pupil facet mirror array
18 Field facets
19 Pupil facets
100 EUV lithography apparatus
102 Laser source
104 Condenser lens
106 Plasma
108 Feed
110 Collector mirror
111 Stop
112 Mirror
114 Field facet mirror
116 Pupil facet mirror
118 Mirror
120 Mirror
122 Plane mirror
124 Reticle
126 Scan direction
128 Projection lens
130 Wafer
300 Substrate
302 Reflective coating
304 Carrying element
306 Actuating rod
308 End piece
310 Double-headed arrow
312 Joint leg
314 Tilt point
318 Thermally conductive fibers
320 Bellows
373 Field mirror facet
396 Flexure
398 Securing sleeve
400 Structural part
402 Matrix material
404 Reinforcing fiber
406 Dispersoid
410 Coating
500 Structural part
502 Matrix material
504 Reinforcing fiber
508 Particle
602 Step
604 Step
606 Step
Z Intermediate focus

What is claimed is:

1. A method for producing a component for a mirror array for extreme ultraviolet (EUV) lithography, having a composite material comprising:
   a copper-containing matrix material;
   a reinforcing material having fibers in the copper-containing matrix material, wherein a majority of the fibers are aligned in a longitudinal direction of the matrix material; and
   particles, in the copper-containing matrix, composed of one or more materials from a group consisting of graphite, diamond-like carbon, and ceramic,
   wherein the component is configured as a structural part of a mirror joint leg,
   wherein the method comprising:
      introducing the reinforcing material into the matrix material;
      shaping the component from the matrix material with the reinforcing material; and
      sintering and/or compacting the shape of the component and/or finishing the component,
      wherein the matrix material is introduced as freshly reduced powder, or
      wherein the shaping and/or the sintering and/or the compacting are/is carried out in a reducing atmosphere.

2. The method as claimed in claim 1, wherein the composite material comprises as the reinforcing material one or more fibers from the group consisting of carbon nanotubes, carbon fiber, mineral fibers, glass fibers, and ceramic fibers.

3. The method as claimed in claim 1, wherein the matrix material is dispersion-hardened.

4. The method as claimed in claim 1, wherein the particles and the fibers composed of reinforcing material are coated.

5. The method as claimed in claim 1, wherein the fibers are coated with one or more materials from the group consisting of metal oxide, molybdenum, and silicon.

6. The method as claimed in claim 1, wherein the fibers are arranged in the matrix material to substantially follow at least one bend of the component and the majority of the fibers align with a geometry of the component.

7. The method as claimed in claim 1, further comprising an at least partial coating.

8. The method as claimed in claim 7, wherein the coating comprises one or more materials from the group consisting of metal oxide, molybdenum, and silicon.

9. The method as claimed in claim 1, wherein the component has a yield point Rp0.2 of greater than 200 N/mm$^2$ at 20° C.

10. The method as claimed in claim 1, wherein the component has a thermal conductivity of greater than 320 W/mK and has modulus of elasticity in a range of approximately 230 GPa to 280 GPa.

11. The method as claimed in claim 1, further comprising:
    introducing a fibrous precursor material of the reinforcing material, and/or introducing a precursor material of particles into the matrix material and, during the shaping and/or the sintering and/or the compacting, reacting the precursor material to form the reinforcing material and/or to form the particle material.

12. The method as claimed in claim 1, wherein the shaping and/or the sintering and/or the compacting comprise extrusion, laser sintering, plasma sintering, hot pressing and/or hot isostatic pressing.

13. The method as claimed in claim 1, wherein the finishing comprises erosion, milling, grinding, polishing and/or coating.

14. The method as claimed in claim 1, wherein the composite material comprises as the reinforcing material one or more fibers from the group consisting of mineral fibers, glass fibers, and ceramic fibers.

15. The method as claimed in claim 1, wherein the particles are composed of one or more materials from the group consisting of graphite and diamond-like carbon.

16. The method as claimed in claim 1, wherein the component further comprises at least one coating that coats only parts of a surface of the component.

17. The method as claimed in claim 1, wherein the majority of the fibers are aligned in a longitudinal direction of the component and wherein the fibers are dispersed within the component and are substantially shorter than the copper-containing matrix material.

18. The method as claimed in claim 1, wherein the particles and/or the fibers composed of reinforcing material are coated with one or more materials from the group consisting of platinum, palladium, titanium, metal oxide, molybdenum, and silicon.

19. The method as claimed in claim 1, wherein the matrix material is hardened with dispersoids composed of aluminum oxide and wherein the mirror joint leg is coated on all sides with a coating comprising alternating molybdenum and silicon layers.

* * * * *